(12) United States Patent
Suwa et al.

(10) Patent No.: US 11,721,750 B2
(45) Date of Patent: Aug. 8, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Takeshi Suwa, Kawasaki Kanagawa (JP); Tomoko Matsudai, Shibuya Tokyo (JP); Yoko Iwakaji, Meguro Tokyo (JP); Hiroko Itokazu, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 164 days.

(21) Appl. No.: 17/399,580

(22) Filed: Aug. 11, 2021

(65) Prior Publication Data
US 2022/0293776 A1 Sep. 15, 2022

(30) Foreign Application Priority Data
Mar. 11, 2021 (JP) .................................. 2021-039143

(51) Int. Cl.
*H01L 29/739* (2006.01)
*H01L 29/417* (2006.01)
*H01L 29/10* (2006.01)

(52) U.S. Cl.
CPC ...... *H01L 29/7397* (2013.01); *H01L 29/1095* (2013.01); *H01L 29/41708* (2013.01)

(58) Field of Classification Search
CPC ............. H01L 29/7397; H01L 29/1095; H01L 29/41708

USPC .......................................................... 257/139
See application file for complete search history.

(56) References Cited

U.S. PATENT DOCUMENTS

| 2002/0179976 A1* | 12/2002 | Takahashi | ........... | H01L 29/7397 |
| | | | | 257/370 |
| 2015/0001578 A1* | 1/2015 | Oh | ...................... | H01L 29/7397 |
| | | | | 438/138 |
| 2015/0295071 A1* | 10/2015 | Hikasa | .................. | H01L 29/456 |
| | | | | 257/144 |

(Continued)

FOREIGN PATENT DOCUMENTS

| JP | 2018049866 A | 3/2018 |
| JP | 2018133493 A | 8/2018 |

*Primary Examiner* — Igwe U Anya
(74) *Attorney, Agent, or Firm* — Kim & Stewart LLP

(57) ABSTRACT

A semiconductor device includes a semiconductor part, first and second electrodes, and a control electrode. The semiconductor part is provided between the first and second electrodes. The semiconductor part includes first to seventh layers. The second of a second conductivity type is provided between the first layer of a first conductivity type and the first electrode. The third and fourth layers of the first conductivity type are arranged along the second layer between the second layer and the first electrode. The fifth layer of the second conductivity type is provided between the second electrode and the first layer. The sixth and seventh layers are arranged along the fifth layer between the first and fifth layers. The sixth and seventh layers include the first-conductivity-type impurities with first and second surface densities, respectively. The first surface density is greater than the second surface density.

18 Claims, 14 Drawing Sheets

(56) References Cited

U.S. PATENT DOCUMENTS

2018/0083131 A1   3/2018   Tamaki

* cited by examiner

SEMICONDUCTOR DEVICE

CROSS-REFERENCE TO RELATED APPLICATIONS

This application is based upon and claims the benefit of priority from Japanese Patent Application No. 2021-039143, filed on Mar. 11, 2021; the entire contents of which are incorporated herein by reference.

FIELD

Embodiments relate to a semiconductor device.

BACKGROUND

It is desirable for a semiconductor device to have a large breakdown immunity to local current concentration. An IGBT (Insulated Gate Bipolar Transistor) used for power control includes an n-p-n parasitic transistor that may be turned on by, for example, excessive current conducted through a so-called current filament. More current concentration is caused thereby, and element breakdown may ultimately occur.

DETAILED DESCRIPTION

Figure 1:
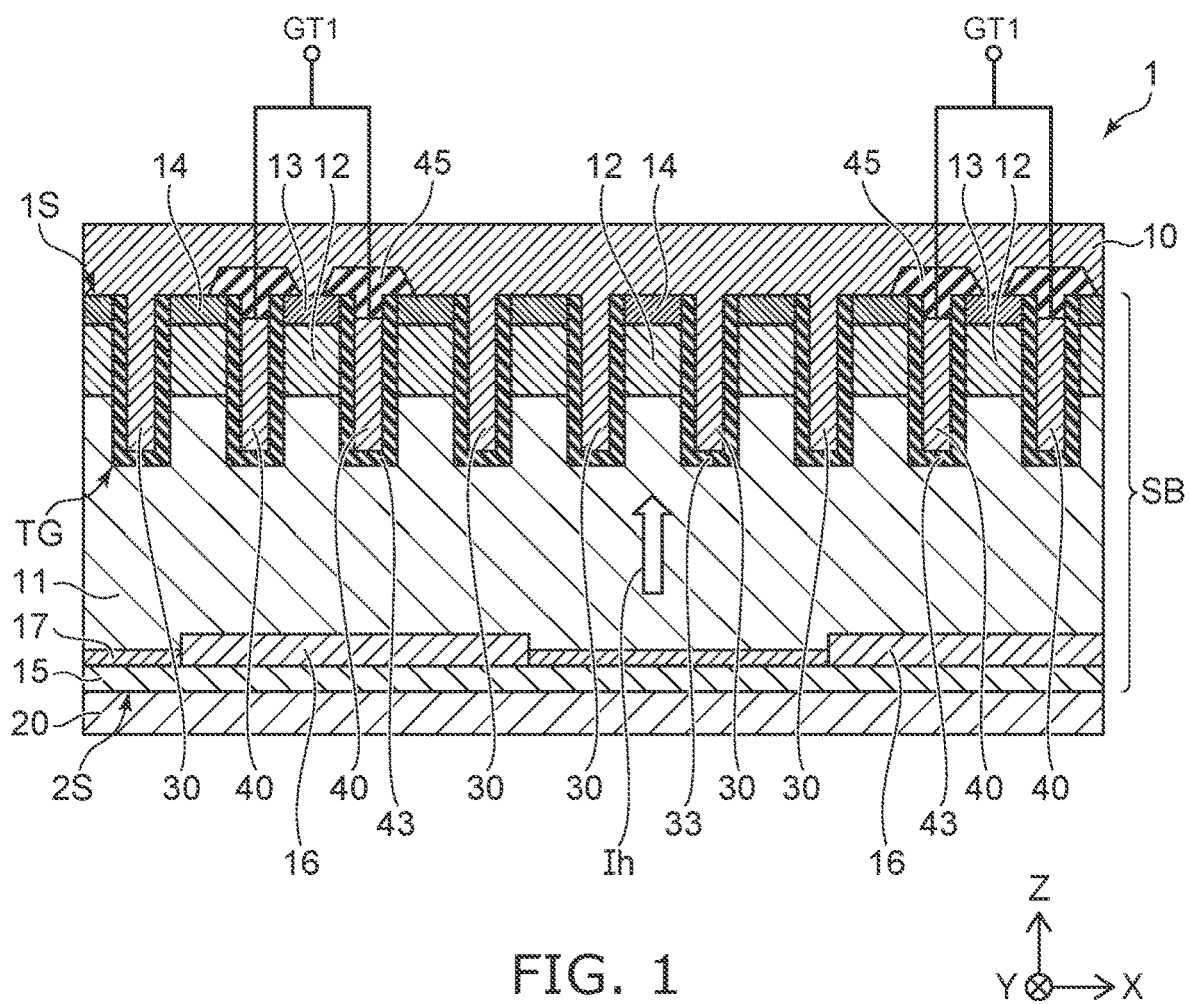
FIG. 1 is a schematic cross-sectional view showing a semiconductor device according to a first embodiment.

According to an embodiment, a semiconductor device includes a semiconductor part, first and second electrodes, and at least one control electrode. The semiconductor part includes a first semiconductor layer of a first conductivity type, a second semiconductor layer of a second conductivity type, a third semiconductor layer of the first conductivity type, at least one fourth semiconductor layer of the second conductivity type, a fifth semiconductor layer of the second conductivity type, at least one sixth semiconductor layer of the first conductivity type, a seventh semiconductor layer of the first conductivity type. The semiconductor part has a first surface and a second surface at a side opposite to the first surface. The first electrode is provided on the first surface of the semiconductor part. The second semiconductor layer is provided between the first semiconductor layer and the first electrode. The third and fourth semiconductor layers are provided between the second semiconductor layer and the first electrode. The first electrode is electrically connected to the third and fourth semiconductor layers. The third and fourth semiconductor layers are arranged along the first surface of the semiconductor part. The second electrode is provided on the second surface of the semiconductor part. The semiconductor part is provided between the first electrode and the second electrode. The first semiconductor layer extends between the first electrode and the second electrode. The fifth semiconductor layer is provided between the second electrode and the first semiconductor layer. The fifth semiconductor layer is electrically connected to the second electrode. The sixth and seventh semiconductor layers are provided between the first and fifth semiconductor layers. The sixth and seventh semiconductor layers are arranged along the fifth semiconductor layer. The sixth and seventh semiconductor layers include a first-conductivity-type impurity with higher concentrations than a concentration of a first-conductivity-type impurity in the first semiconductor layer. The sixth semiconductor layer includes the first-conductivity-type impurity with a first surface density in a plane parallel to the second surface. The seventh semiconductor layer includes the first-conductivity-type impurity with a second surface density in the plane parallel to the second surface. The first surface density is greater than the second surface density. The seventh semiconductor layer is provided between two adjacent portions of the sixth semiconductor layer, or between the sixth semiconductor layer and another sixth semiconductor layer. The control electrode is provided between the semiconductor part and the first electrode. The control electrode is electrically insulated from the semiconductor part by a first insulating film and electrically insulated from the first electrode by a second insulating film. The control electrode faces the first and second semiconductor layers via the first insulating film. The first to third semiconductor layers are arranged along the first insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is, for example, an IGBT.

As shown in FIG. 1, the semiconductor device 1 includes a semiconductor part SB, a first electrode 10, a second electrode 20, a third electrode 30, and a control electrode 40. The semiconductor part SB is, for example, silicon. The first electrode 10 is, for example, an emitter electrode. The second electrode 20 is, for example, a collector electrode. The third electrode 30 is, for example, an electrode plate that has the same potential as the emitter electrode. The control electrode 40 is, for example, a gate electrode.

The semiconductor part SB includes a first surface 1S and a second surface 2S. The second surface 2S is the back surface at the side opposite to the first surface 1S. The first electrode 10 is provided on the first surface 1S. The second electrode 20 is provided on the second surface 2S. In other words, the semiconductor part SB is provided between the first electrode 10 and the second electrode 20.

The semiconductor part SB includes, for example, a first semiconductor layer 11 of a first conductivity type, a second semiconductor layer 12 of a second conductivity type, a third semiconductor layer 13 of the first conductivity type, a fourth semiconductor layer 14 of the second conductivity type, a fifth semiconductor layer 15 of the second conductivity type, a sixth semiconductor layer 16 of the first conductivity type, and a seventh semiconductor layer 17 of the first conductivity type. Hereinbelow, the first conductivity type is described as an n-type; and the second conductivity type is described as a p-type.

The first semiconductor layer 11 is, for example, an n-type base layer. The first semiconductor layer 11 extends between the first electrode 10 and the second electrode 20.

The second semiconductor layer 12 is, for example, a p-type base layer. The second semiconductor layer 12 is provided between the first semiconductor layer 11 and the first electrode 10.

The third semiconductor layer 13 is, for example, an n-type emitter layer. The third semiconductor layer 13 is partially provided between the second semiconductor layer 12 and the first electrode 10. The third semiconductor layer 13 is electrically connected to the first electrode 10.

The fourth semiconductor layer 14 is, for example, a p-type contact layer. The fourth semiconductor layer 14 is partially provided between the second semiconductor layer 12 and the first electrode 10. The fourth semiconductor layer 14 is electrically connected to the first electrode 10. The fourth semiconductor layer 14 includes a second-conductivity-type impurity with a higher concentration than a concentration of a second-conductivity-type impurity in the second semiconductor layer 12.

The third semiconductor layer 13 and the fourth semiconductor layer 14 are provided on the second semiconductor layer 12 and are arranged along, for example, the first surface 1S of the semiconductor part SB. The second semiconductor layer 12 is electrically connected to the first electrode 10 via the fourth semiconductor layer 14.

The fifth semiconductor layer 15 is, for example, a collector layer. The fifth semiconductor layer 15 is provided between the first semiconductor layer 11 and the second electrode 20. The fifth semiconductor layer 15 is electrically connected to the second electrode 20.

The sixth semiconductor layer 16 and the seventh semiconductor layer 17 are, for example, n-type buffer layers. The sixth semiconductor layer 16 and the seventh semiconductor layer 17 are provided between the first semiconductor layer 11 and the fifth semiconductor layer 15. For example, the sixth semiconductor layer 16 and the seventh semiconductor layer 17 are arranged in a direction, e.g., an X-direction that is along the second surface 2S of the semiconductor part SB. The sixth semiconductor layer 16 and the seventh semiconductor layer 17 include first-conductivity-type impurities with higher concentrations than a concentration of a first-conductivity-type impurity in the first semiconductor layer 11.

The seventh semiconductor layer 17, for example, is provided between a portion and another portion of the sixth semiconductor layer 16. Alternatively, the seventh semiconductor layer 17 is provided between a sixth semiconductor layer 16 and another sixth semiconductor layer 16.

The sixth semiconductor layer 16, includes a first-conductivity-type impurity with, for example, a first surface density in a plane parallel to the second surface 2S of the semiconductor part SB. The seventh semiconductor layer 17 includes a first-conductivity-type impurity with, for example, a second surface density in the plane parallel to the second surface 2S of the semiconductor part SB. The first surface density is greater than the second surface density.

The layer thickness of the sixth semiconductor layer 16 is greater than the layer thickness of the seventh semiconductor layer 17 in a direction from the second electrode 20 toward the first electrode 10, e.g., a Z-direction.

The third electrode 30 and the control electrode 40, for example, are provided between the semiconductor part SB and the first electrode 10. The third electrode 30 and the control electrode 40 are provided respectively inside trenches TG. The trenches TG have depths enough to extend from the first surface 1S of the semiconductor part SB into the first semiconductor layer 11. The third electrode 30 and the control electrode 40 are arranged along the first surface 1S. Two control electrodes 40 are arranged in, for example, the X-direction. Multiple third electrodes 30 are provided between the two control electrodes 40. The third electrode 30 and the control electrode 40 are, for example, electrically-conductive polysilicon.

An insulating film 33 is provided between the third electrode 30 and the semiconductor part SB. The insulating film 33 is, for example, a silicon oxide film. The third electrode 30, for example, is electrically connected to the first electrode 10. The third electrode 30 has the same potential as the first electrode 10.

The control electrode 40 is electrically insulated from the semiconductor part SB by an insulating film 43. Also, the control electrode 40 is electrically insulated from the first electrode 10 by an insulating film 45. The control electrode 40 is electrically connected to a control terminal GT1. The insulating film 43 and the insulating film 45 are, for example, silicon oxide films. The control terminal GT1 is, for example, a gate pad.

The second semiconductor layer 12, for example, is provided respectively between two adjacent third electrodes 30 and between the third electrode 30 and the control electrode 40. The second semiconductor layer 12 may be provided between, for example, two adjacent control electrodes 40.

Embodiments are not limited to examples that include multiple second semiconductor layers 12. The second semiconductor layer 12 may be a continuous body, and may include portions that are provided respectively between the two third electrodes 30 and between the third electrode 30 and the control electrode 40.

The first semiconductor layer 11 and the second semiconductor layer 12 face the third electrode 30 via the insulating film 43. Also, the first semiconductor layer 11 and the second semiconductor layer 12 face the control electrode 40 via the insulating film 43. The third semiconductor layer 13 is provided between the first electrode 10 and the second semiconductor layer 12. The third semiconductor layer 13 contacts, for example, the insulating film 43.

When turning on the semiconductor device 1, for example, a first-conductivity-type inversion layer is induced at the interface between the second semiconductor layer 12 and the insulating film 33; and the first semiconductor layer 11 and the third semiconductor layer 13 are electrically connected. Thereby, first-conductivity-type carriers (electrons) are injected from the third semiconductor layer 13 into the first semiconductor layer 11 via the first-conductivity-type inversion layer. Accordingly, second-conductivity-type carriers (hereinbelow, holes) are injected from the fifth semiconductor layer 15 into the first semiconductor layer 11 via the sixth and seventh semiconductor layers 16 and 17. The holes are injected from the first semiconductor layer 11 into the second semiconductor layer 12 and are ejected into the first electrode 10 via the fourth semiconductor layer 14.

The seventh semiconductor layer 17 includes a first-conductivity-type impurity with a lower surface density than a surface density of a first-conductivity-type impurity in the sixth semiconductor layer 16. Thereby, the amount of the holes injected into the first semiconductor layer 11 via the seventh semiconductor layer 17 is greater than the amount of the holes injected into the first semiconductor layer 11 via the sixth semiconductor layer 16. In a region of the first semiconductor layer 11 that is positioned between the second semiconductor layer 12 and the seventh semiconductor layer 17, the hole density is greater than the hole density in another region of the first semiconductor layer 11 that is positioned between the second semiconductor layer 12 and the sixth semiconductor layer 16. More holes are ejected into the first electrode 10 from the region of the first semiconductor layer 11 between the seventh semiconductor layer 17 and the first electrode 10. Therefore, a so-called current filament due to a hole current Ih is easily induced between the seventh semiconductor layer 17 and the first electrode 10.

When such a current filament is induced in the semiconductor part SB, the temperature increases in the vicinity of the current filament. Then, the current filament moves toward a region of a lower temperature. In the semiconductor device 1, the current filament moves in a region parallel to the second surface 2S of the semiconductor part SB. That is, the current filament moves in the seventh semiconductor layer 17. In other words, in the semiconductor device 1, the current filament can be confined in the region in which the seventh semiconductor layer 17 is provided.

On the other hand, in the semiconductor device 1, the third semiconductor layer 13 is provided between the first electrode 10 and the sixth semiconductor layer 16. That is, in the semiconductor device 1, the n-p-n parasitic transistor is provided between the first electrode 10 and the sixth semiconductor layer 16. Therefore, in the semiconductor device 1, the current filament is not induced at the vicinity of the n-p-n parasitic transistor. Thus, it is possible to prevent the n-p-n parasitic transistor from turning on; and the breakdown immunity can be increased.

Figure 2:
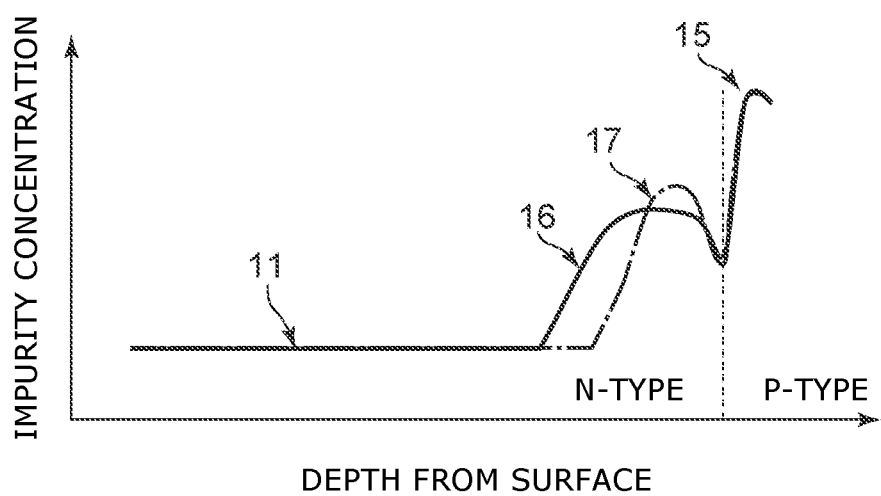
FIG. 2 is a schematic view showing the configuration of the semiconductor device according to the first embodiment.

FIG. 2 is a schematic view showing the configuration of the semiconductor device 1 according to the first embodiment. FIG. 2 illustrates impurity distributions of the first semiconductor layer 11, the fifth semiconductor layer 15, the sixth semiconductor layer 16, and the seventh semiconductor layer 17. The horizontal axis is the depth in the direction from the first surface 1S toward the second surface 2S. The vertical axis is the impurity concentration of each layer.

The concentration of the first-conductivity-type impurity (i.e., the n-type impurity) is shown for the first semiconductor layer 11, the sixth semiconductor layer 16, and the seventh semiconductor layer 17; and the concentration of the second-conductivity-type impurity (i.e., the p-type impurity) is shown for the fifth semiconductor layer 15.

As shown in FIG. 2, the first-conductivity-type impurity concentrations of the sixth semiconductor layer 16 and the seventh semiconductor layer 17 are greater than the concentration of the first-conductivity-type impurity in the first semiconductor layer 11. The peak value of the impurity concentration in the fifth semiconductor layer 15 is greater than the impurity concentration in the sixth semiconductor layer 16 and the impurity concentration in the seventh semiconductor layer 17. The width in the depth direction of the sixth semiconductor layer 16 is, for example, greater than the width in the depth direction of the seventh semiconductor layer 17.

The peak value of the impurity concentration of the seventh semiconductor layer 17 is, for example, greater than the peak value of the impurity concentration of the sixth semiconductor layer 16. The distance from the peak position of the impurity distribution in the seventh semiconductor layer 17 to the second surface 2S of the semiconductor part SB (referring to FIG. 1) is less than the distance from the peak position of the impurity distribution in the sixth semiconductor layer 16 to the second surface 2S of the semiconductor part SB. In other words, the peak of the impurity distribution in the seventh semiconductor layer 17 is positioned between the peak position of the impurity distribution in the fifth semiconductor layer 15 and the peak position of the impurity distribution in the sixth semiconductor layer 16.

The fifth semiconductor layer 15, the sixth semiconductor layer 16, and the seventh semiconductor layer 17 are formed by for example, ion-implanting a second-conductivity-type impurity and a first-conductivity-type impurity through the second surface 2S of the semiconductor part SB. The first-conductivity-type impurity is, for example, phosphorus (P); and the second-conductivity-type impurity is, for example, boron (B).

The ion implantation energy for forming the seventh semiconductor layer 17 is, for example, less than the ion implantation energy for forming the sixth semiconductor layer 16. The ion implantation energy for forming the fifth semiconductor layer 15 is less than the ion implantation energy for forming the seventh semiconductor layer 17. In the seventh semiconductor layer 17, the dose amount of the first-conductivity-type impurity is less than the dose amount of the first-conductivity-type impurity in the sixth semiconductor layer 16.

Embodiments are not limited to the example described above; the first-conductivity-type impurity may be selectively ion-implanted to form the sixth semiconductor layer 16, for example, after ion-implanting the first-conductivity-type impurity into the entire surface of the second surface 2S to form the seventh semiconductor layer 17. In other words, the sixth semiconductor layer 16 may be formed by double ion implantation.

Figure 3:
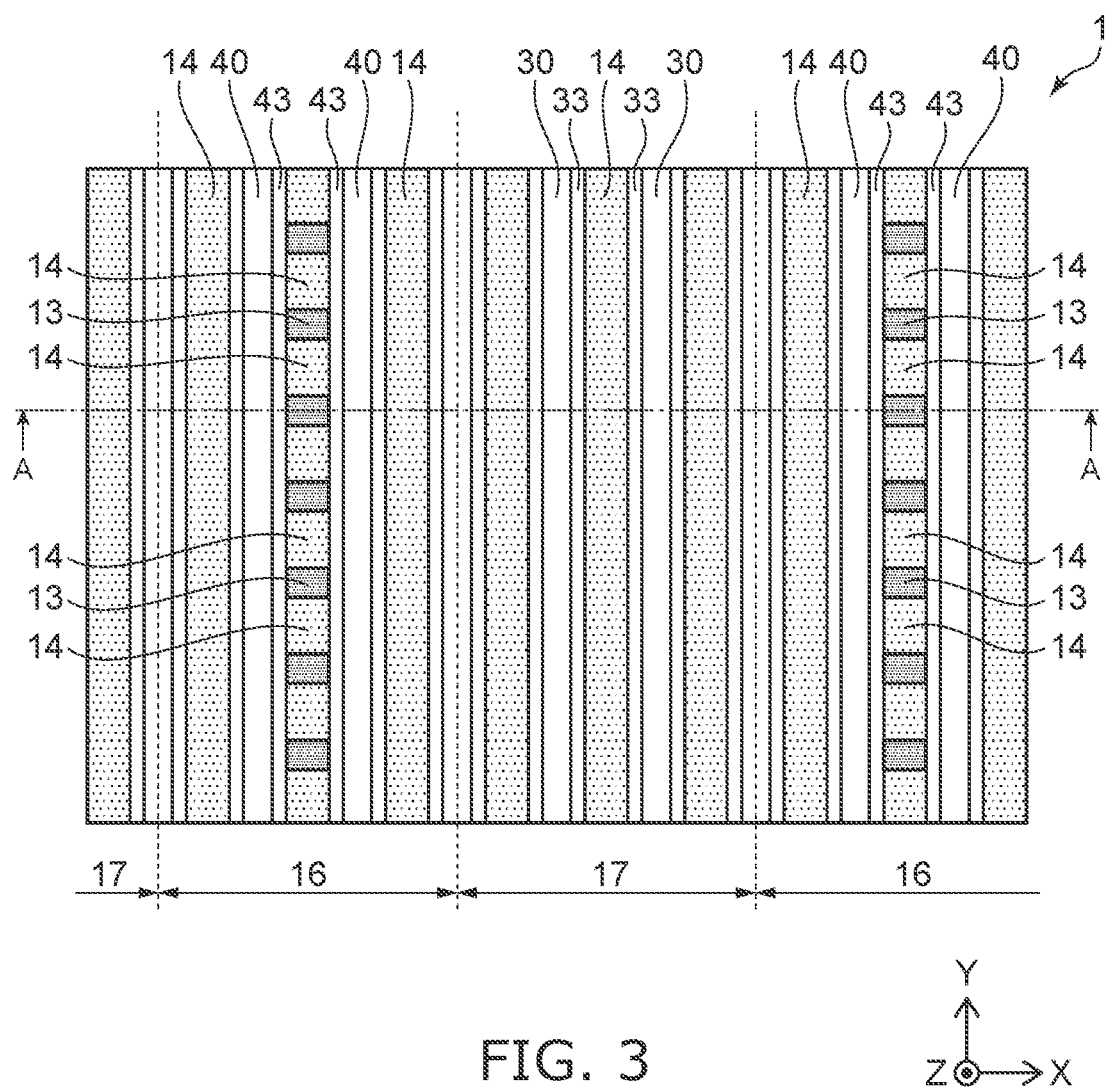
FIG. 3 is a schematic plan view showing the semiconductor device according to the first embodiment.

FIG. 3 is a schematic plan view showing the semiconductor device 1 according to the first embodiment. FIG. 3 illustrates the first surface of the semiconductor part SB without the first electrode 10 and the insulating film 45. It should be noted that FIG. 1 is a cross-sectional view along line A-A shown in FIG. 3, for example.

As shown in FIG. 3, the third electrode 30 and the control electrode 40 extend in the Y-direction. For example, the third semiconductor layer 13 and the fourth semiconductor layer 14 are alternately arranged in the Y-direction between the two control electrodes 40 that are proximate in the X-direction. The width in the Y-direction of the third semiconductor layer 13 is, for example, less than the width in the Y-direction of the fourth semiconductor layer 14. Other fourth semiconductor layers 14 extend in the Y-direction respectively between two adjacent third electrodes 30 in the X-direction and between the third electrode 30 and the control electrode 40 that are adjacent to each other in the X-direction.

As shown by the broken lines in FIG. 3, the sixth semiconductor layer 16 and the seventh semiconductor layer 17 extend in the same direction (the Y-direction) as the third electrode and the control electrode 40.

Figure 4:
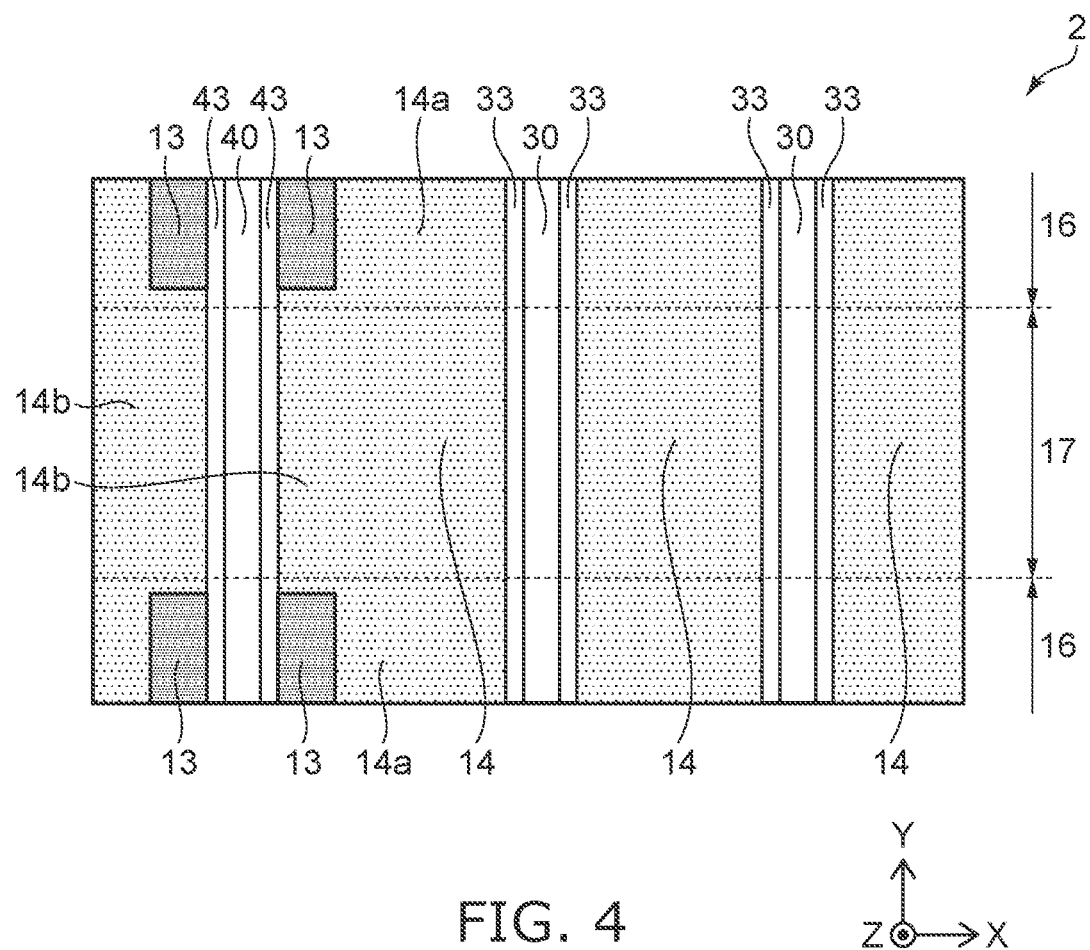
FIG. 4 is a schematic plan view showing a semiconductor device according to a first modification of the first embodiment.

FIG. 4 is a schematic plan view showing a semiconductor device 2 according to a first modification of the first embodiment. FIG. 4 illustrates the first surface 1S of the semiconductor part SB (referring to FIG. 1) without the first electrode 10 and the insulating film 45. Also, in the example, the third electrode 30 and the control electrode 40 extend in the Y-direction.

As shown in FIG. 4, the third semiconductor layer 13 is partially provided between the third electrode 30 and the control electrode 40 that are adjacent to each other in the X-direction. Multiple third semiconductor layers 13 are arranged in the extension direction of the control electrode 40 (the Y-direction). The third semiconductor layers 13 each contact the insulating film 43. The multiple third semiconductor layers 13 are apart from each other in the Y-direction. The third semiconductor layers 13 are arranged in the X-direction with the control electrode 40 interposed.

The fourth semiconductor layer 14 extends in the Y-direction and is provided between two third electrodes 30 that are adjacent to each other in the X-direction. The fourth semiconductor layer 14 is also provided between the third electrode 30 and the control electrode 40 that are adjacent to each other in the X-direction. The fourth semiconductor layer 14 contacts the insulating film 33 between the third electrode 30 and the control electrode 40. The fourth semiconductor layer 14 includes a first portion 14a and a second portion 14b between the third electrode 30 and the control electrode 40. The first portion 14a is positioned between the third semiconductor layer 13 and the insulating film 33. The second portion 14b contacts the insulating film 43 and extends between two third semiconductor layers 13 that are adjacent to each other in the Y-direction.

The sixth semiconductor layer 16 and the seventh semiconductor layer 17 extend in the X-direction. The seventh semiconductor layer 17 is provided between two sixth semiconductor layer 16 that are arranged in the Y-direction. The seventh semiconductor layer 17 is provided below the second portion 14b of the fourth semiconductor layer 14. The sixth semiconductor layer 16 is provided below the third semiconductor layer 13.

Figure 5:
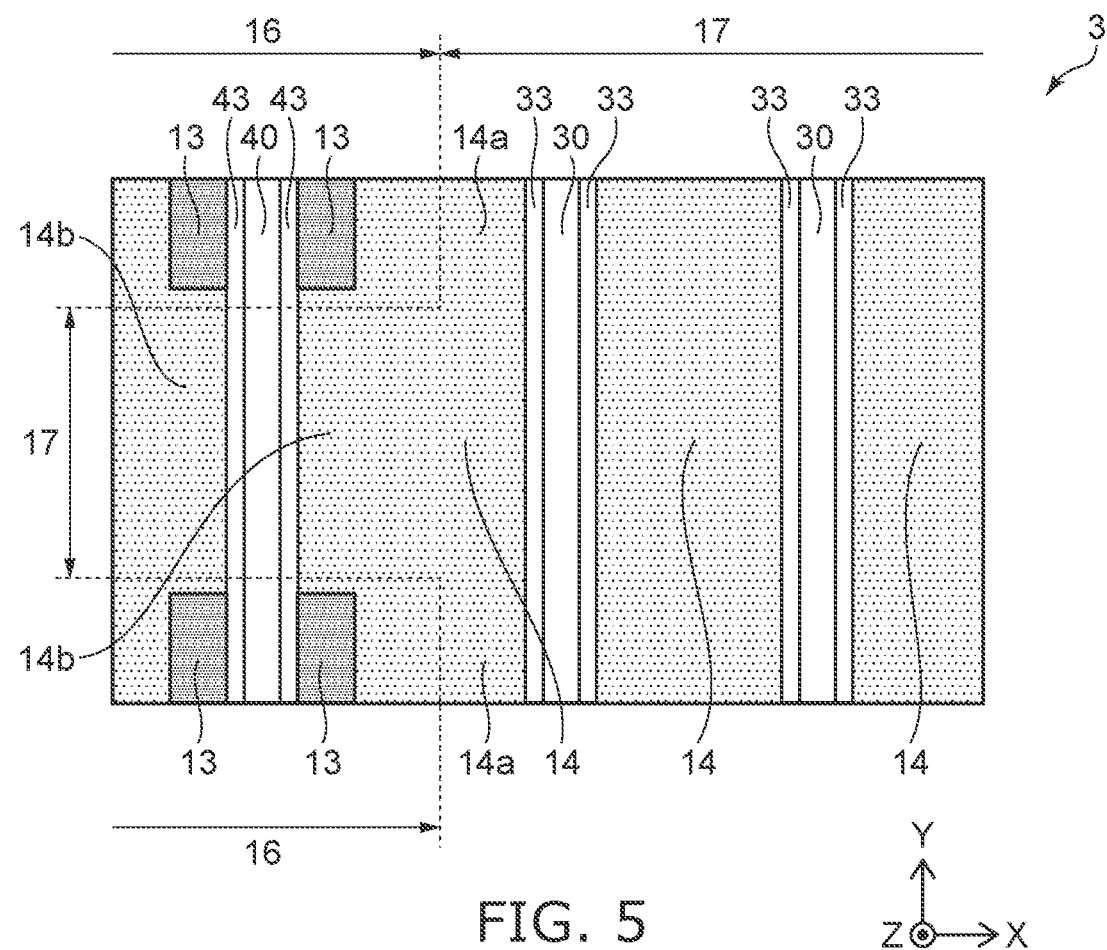
FIG. 5 is a schematic plan view showing a semiconductor device according to a second modification of the first embodiment.

FIG. 5 is a schematic plan view showing a semiconductor device 3 according to a second modification of the first embodiment. FIG. 5 illustrates the first surface 1S of the semiconductor part SB (referring to FIG. 1) without the first electrode 10 and the insulating film 45.

As shown in FIG. 5, the third electrode 30 and the control electrode 40 extend in the Y-direction. The third semiconductor layer 13 is partially provided between the third electrode 30 and the control electrode 40 that are adjacent to each other in the X-direction. The multiple third semiconductor layers 13 are arranged in the extension direction of the control electrode 40 (i.e., the Y-direction). The multiple third semiconductor layers contact the insulating film 43. The multiple third semiconductor layers 13 are apart from each other in the Y-direction. The third semiconductor layers 13 are arranged in the X-direction with the control electrode 40 interposed.

A fourth semiconductor layer 14 is provided between two third electrodes 30 that are adjacent to each other in the X-direction. Another fourth semiconductor layer 14 is provided between the third electrode 30 and the control electrode 40 that are adjacent to each other in the X-direction. Also, in the example, the fourth semiconductor layer 14 includes the first portion 14a and the second portion 14b between the third electrode 30 and the control electrode 40. The first portion 14a is provided between the third semiconductor layer 13 and the insulating film 33. The second portion 14b contacts the insulating film 43 and extends between two third semiconductor layers 13 that are adjacent to each other in the Y-direction.

The seventh semiconductor layer 17 is provided below the fourth semiconductor layer 14 between the two third electrodes 30. The seventh semiconductor layer 17 is also provided below the first portion 14a of the fourth semiconductor layer 14 and below the second portion 14b of the fourth semiconductor layer 14. The sixth semiconductor layer 16 is provided below the third semiconductor layer 13.

As shown in FIGS. 3 to 5, the sixth semiconductor layer 16 and the seventh semiconductor layer 17 can be arbitrarily provided. Planar arrangements of the sixth and seventh semiconductor layers 16 and 17 will now be described with reference to FIGS. 6A to 10B.

Figure 6A:
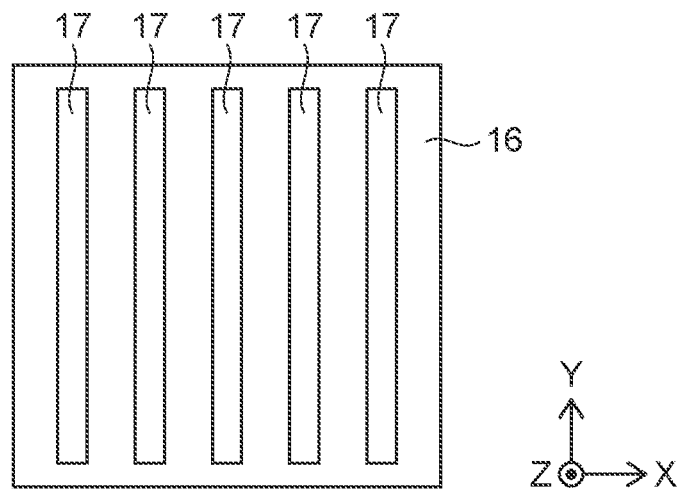
FIGS. 6A to 6C are schematic plan views showing a semiconductor device according to a third modification of the first embodiment.
Figure 6B:
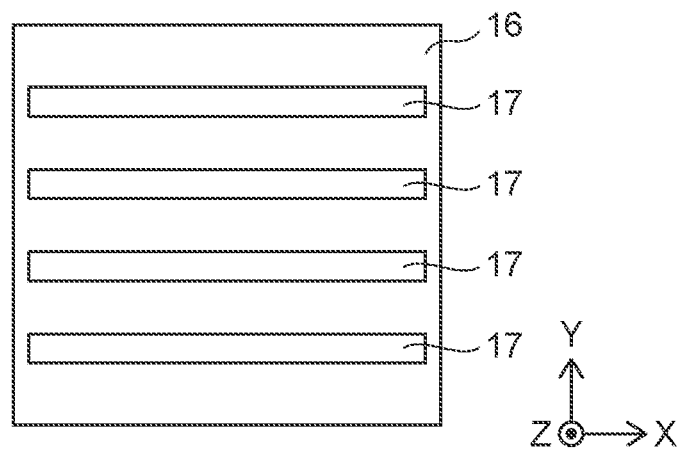
Figure 6C:
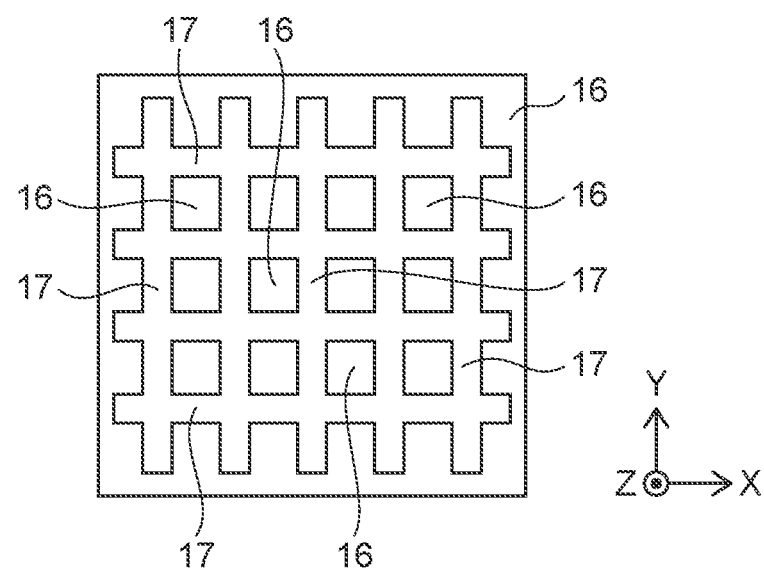

FIGS. 6A to 6C are schematic plan views showing a semiconductor device according to a third modification of the first embodiment. FIGS. 6A to 6C are plan views illustrating the sixth semiconductor layer 16 and the seventh semiconductor layer 17 that are provided on the fifth semiconductor layer 15.

As shown in FIG. 6A, the sixth semiconductor layer 16 surrounds multiple seventh semiconductor layers 17. The multiple seventh semiconductor layers 17 extend in the Y-direction and are arranged in the X-direction. The sixth semiconductor layer 16 includes portions that extend between the seventh semiconductor layers 17 that are arranged in the X-direction.

As shown in FIG. 6B, the multiple seventh semiconductor layers 17 may extend in the X-direction and may be arranged in the Y-direction in the sixth semiconductor layer 16.

As shown in FIG. 6C, the seventh semiconductor layer 17 is provided in, for example, a lattice shape. The sixth semiconductor layer 16 surrounds the lattice-shaped seventh semiconductor layer 17 along the outer perimeter of the seventh semiconductor layer 17. The sixth semiconductor layer 16 is also provided inside the lattice-shaped seventh semiconductor layer 17.

Figure 7A:
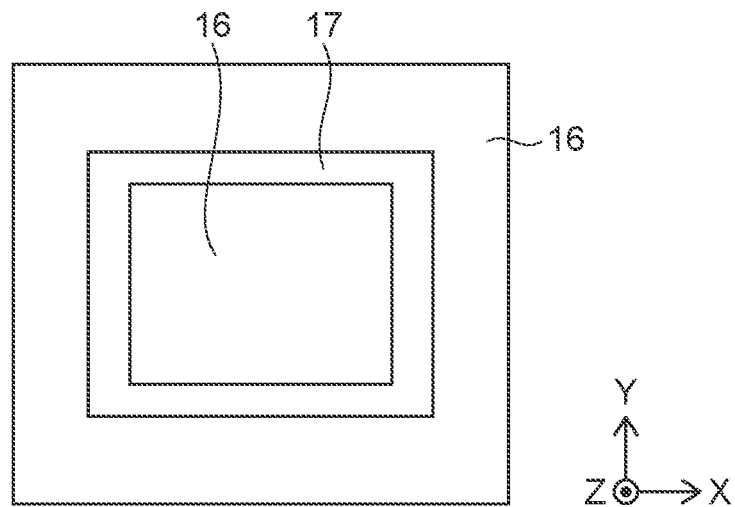
FIGS. 7A to 7C are schematic plan views showing a semiconductor device according to a fourth modification of the first embodiment.
Figure 7B:
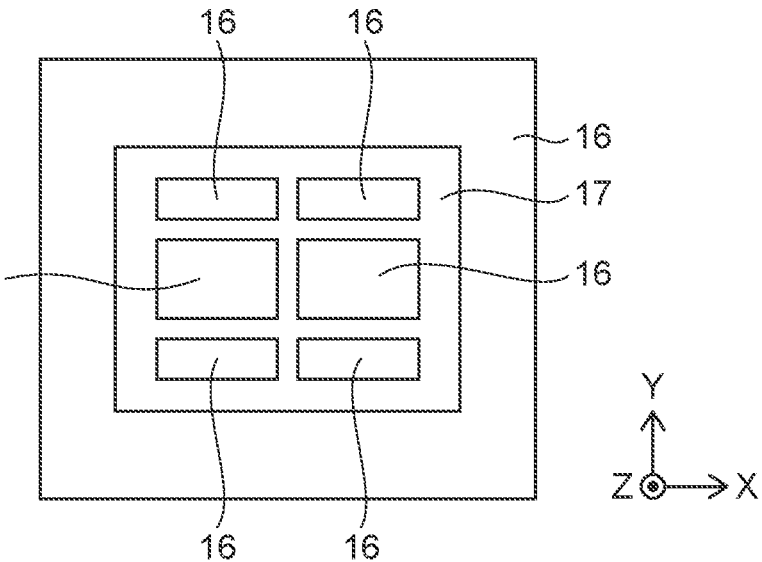
Figure 7C:
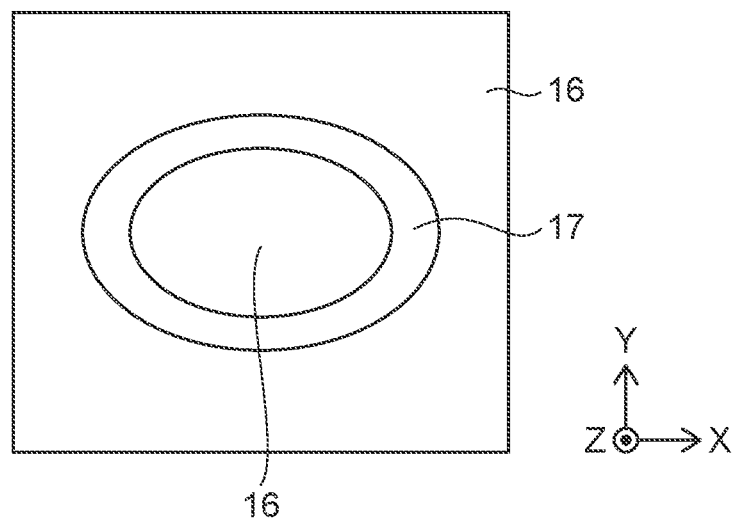

FIGS. 7A to 7C are schematic plan views showing a semiconductor device according to a fourth modification of the first embodiment. FIGS. 7A to 7C are plan views illustrating the sixth semiconductor layer 16 and the seventh semiconductor layer 17 that are provided on the fifth semiconductor layer 15.

As shown in FIG. 7A, the seventh semiconductor layer 17 has, for example, a frame shape. The sixth semiconductor layer 16 surrounds the seventh semiconductor layer 17 along the outer perimeter of the seventh semiconductor layer 17. The sixth semiconductor layer 16 is also provided inside the frame-shaped seventh semiconductor layer 17.

As shown in FIG. 7B, for example, the seventh semiconductor layer 17 includes the combined shape of a frame-shaped portion and a lattice-shaped portion that is provided inside the frame-shaped portion. The sixth semiconductor layer 16 surrounds the seventh semiconductor layer 17 along the outer perimeter of the seventh semiconductor layer 17. The sixth semiconductor layer 16 is also provided inside the lattice-shaped seventh semiconductor layer 17.

As shown in FIG. 7C, the seventh semiconductor layer 17 may have a circular or elliptical frame shape. The sixth semiconductor layer 16 surrounds the seventh semiconductor layer 17 along the outer perimeter of the seventh semiconductor layer 17. The sixth semiconductor layer 16 is also provided inside the frame-shaped seventh semiconductor layer 17.

Figure 8A:
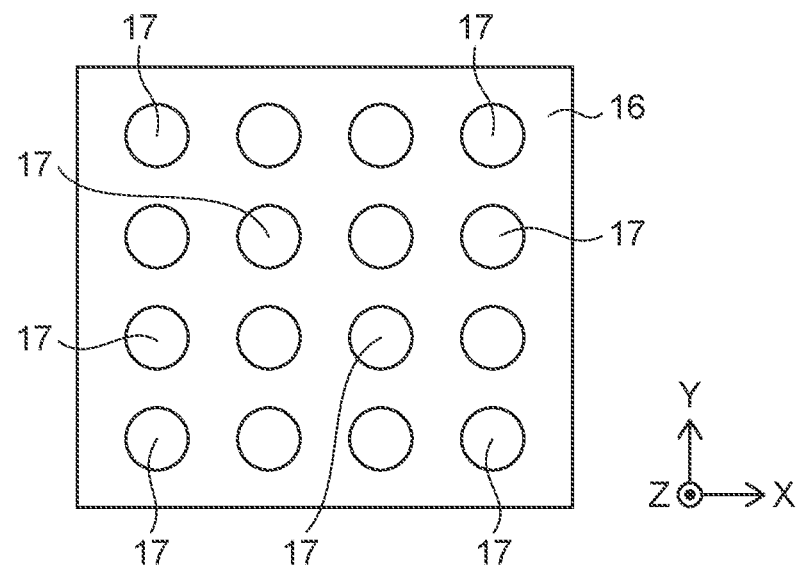
FIGS. 8A and 8B are schematic plan views showing a semiconductor device according to a fifth modification of the first embodiment.
Figure 8B:
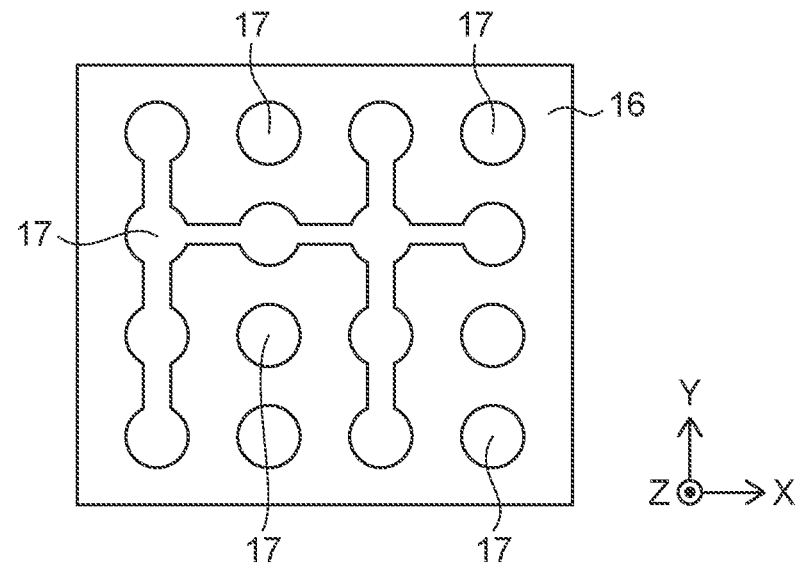

FIGS. 8A and 8B are schematic plan views showing a semiconductor device according to a fifth modification of the first embodiment. FIGS. 8A and 8B are plan views illustrating the sixth semiconductor layer 16 and the seventh semiconductor layer 17 that are provided on the fifth semiconductor layer 15.

As shown in FIG. 8A, the multiple seventh semiconductor layers 17 each have island shapes. The seventh semiconductor layer 17 may have a circular, elliptical, or rectangular shape. The sixth semiconductor layer 16 surrounds the multiple seventh semiconductor layers 17. The multiple seventh semiconductor layers 17 are arranged in, for example, the X-direction and the Y-direction.

As shown in FIG. 8B, the multiple seventh semiconductor layers 17 may include a portion linked to each other. Other portions of the multiple seventh semiconductor layers 17 that are not linked to each other are arranged as island shapes. The portion of the multiple seventh semiconductor layers 17 are formed to have a continuous body linked in the X-direction and the Y-direction.

Figure 9A:
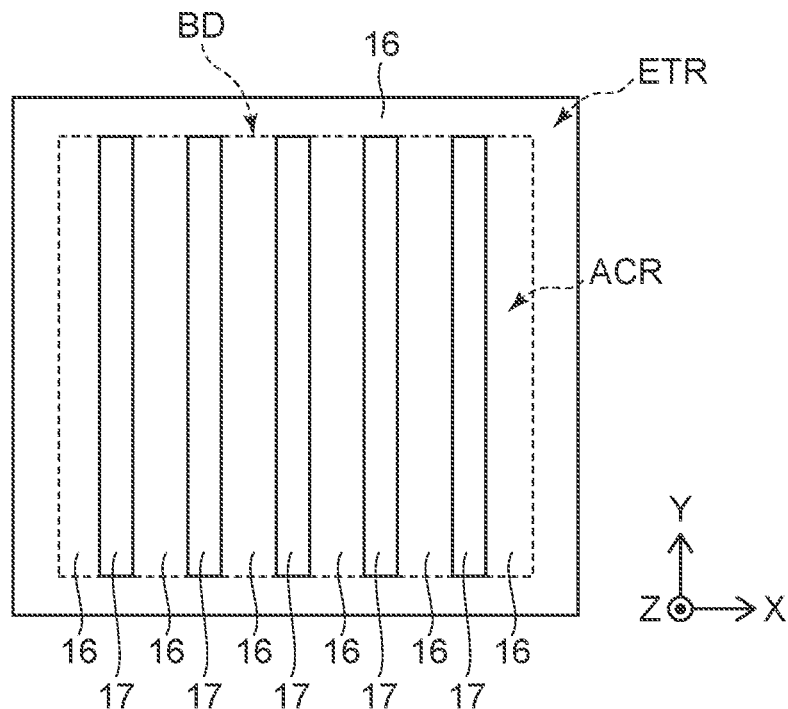
FIGS. 9A and 9B are schematic plan views showing a semiconductor device according to a sixth modification of the first embodiment.
Figure 9B:
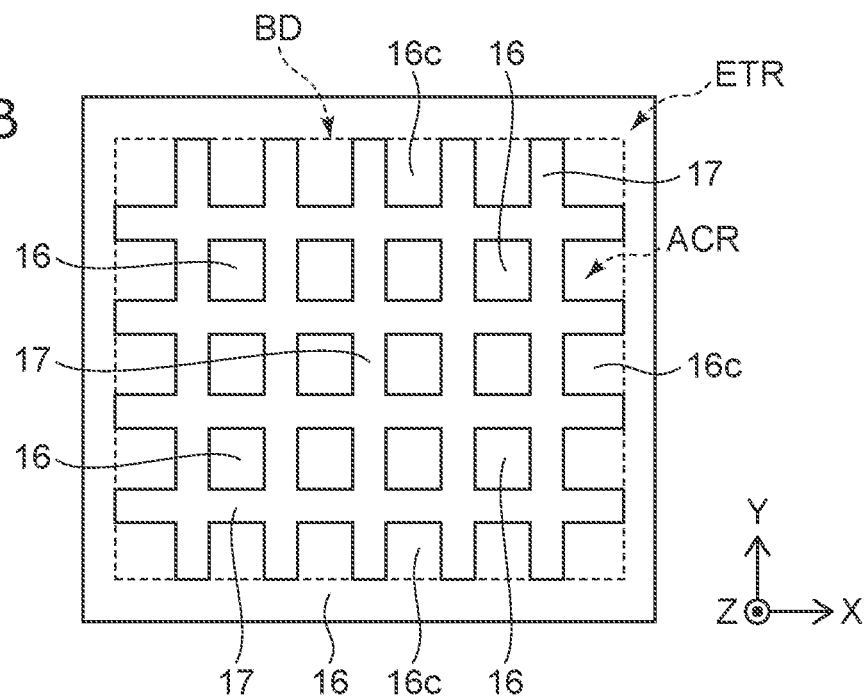

FIGS. 9A and 9B are schematic plan views showing a semiconductor device according to a sixth modification of the first embodiment. FIGS. 9A and 9B are plan views illustrating the sixth semiconductor layer 16 and the seventh semiconductor layer 17 that are provided on the fifth semiconductor layer 15.

The semiconductor part SB includes, for example, an active region ACR that includes the second semiconductor layer 12, the third semiconductor layer 13, and the fourth semiconductor layer 14, and a termination region ETR that surrounds the active region ACR. The broken lines shown in FIG. 9A and in FIG. 9B are a boundary BD between the active region ACR and the termination region ETR.

As shown in FIG. 9A, the multiple seventh semiconductor layers 17 are provided in the active region ACR. For example, the seventh semiconductor layers 17 extend in the Y-direction; and both ends of each seventh semiconductor layer 17 are provided at the boundary BD between the active region ACR and the termination region ETR. The sixth semiconductor layer 16 includes portions that are provided between the multiple seventh semiconductor layers 17 that are arranged in the X-direction. The sixth semiconductor layer 16 also includes a portion that is provided in the termination region ETR and surrounds the active region ACR along the boundary BD.

As shown in FIG. 9B, the seventh semiconductor layer 17 is provided in a lattice shape in the active region ACR. The ends of the seventh semiconductor layer 17 are positioned at the boundary BD between the active region ACR and the termination region ETR. The sixth semiconductor layer 16 surrounds the seventh semiconductor layer 17 along the boundary BD in the termination region ETR. The sixth semiconductor layer 16 is also provided inside the lattice-shaped seventh semiconductor layer 17. The sixth semiconductor layer 16 that is provided in the termination region ETR includes portions 16c that extend into the active region ACR between the ends of the seventh semiconductor layer 17. The seventh semiconductor layer 17 includes, for example, a portion that is provided between two adjacent sixth semiconductor layers 16 in the active region ACR.

As shown in FIGS. 9A and 9B, the seventh semiconductor layer 17 is provided so that the current filament is induced inside the active region ACR. In other words, current concentration is prevented in the termination region ETR.

Figure 10A:
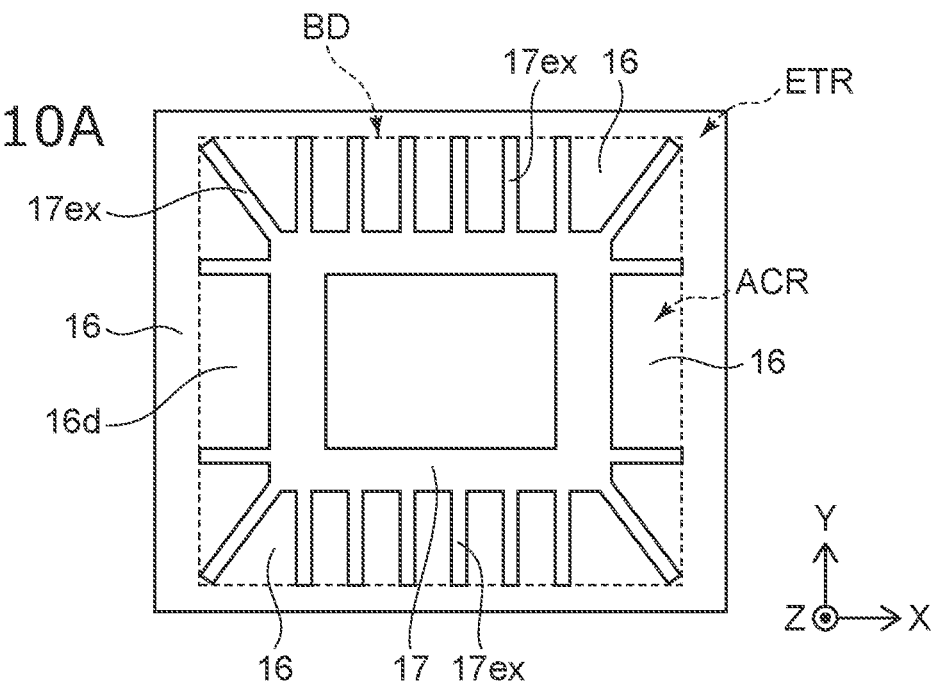
FIGS. 10A and 10B are schematic plan views showing a semiconductor device according to a seventh modification of the first embodiment.
Figure 10B:
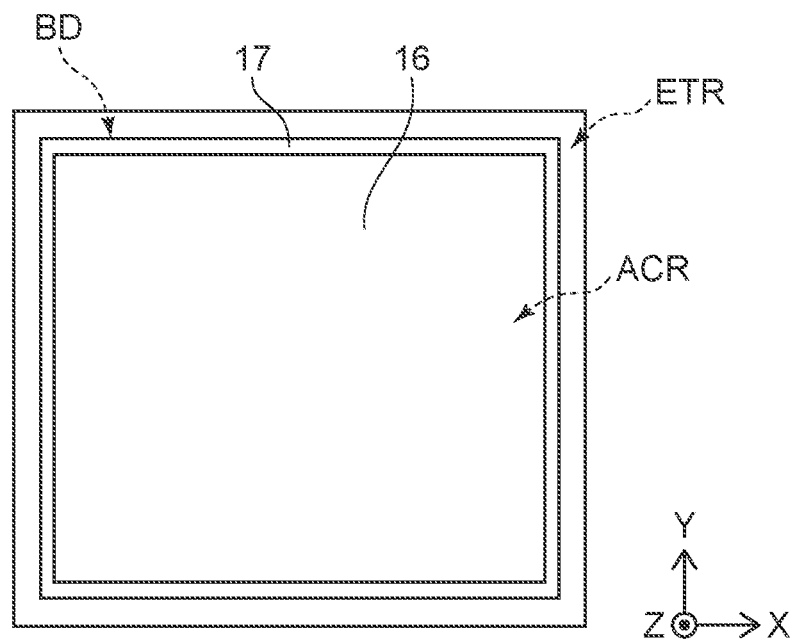

FIGS. 10A and 10B are schematic plan views showing a semiconductor device according to a seventh modification of the first embodiment. FIGS. 10A and 10B are plan views illustrating the sixth semiconductor layer 16 and the seventh semiconductor layer 17 that are provided on the fifth semiconductor layer 15.

As shown in FIG. 10A, the seventh semiconductor layer 17 includes a frame-shaped portion that is provided in the active region ACR, and multiple extension portions 17ex that extend from the frame-shaped portion to the boundary BD between the active region ACR and the termination region ETR. The sixth semiconductor layer 16 is provided inside the frame-shaped seventh semiconductor layer 17. The sixth semiconductor layer 16 is also provided in the termination region ETR and surrounds the active region ACR along the boundary BD. The sixth semiconductor layer 16 that is provided in the termination region ETR includes a portion 16d that extends into the active region ACR between the extension portions 17ex of the seventh semiconductor layer 17. The current filament induced at the vicinity of the boundary BD between the active region ACR and the termination region ETR, for example, is guided to the frame-shaped portion of the seventh semiconductor layer 17 via the extension portions 17ex.

As shown in FIG. 10B, the seventh semiconductor layer 17 is provided along the boundary BD between the active region ACR and the termination region ETR. The sixth semiconductor layer 16 is provided in both the active region ACR and the termination region ETR. The seventh semiconductor layer 17 is provided between the sixth semiconductor layer 16 provided in the active region ACR and another sixth semiconductor layer 16 provided in the termination region ETR. Thereby, the current filament occurs between the active region ACR and the termination region ETR and moves along the boundary BD.

Second Embodiment

Figure 11:
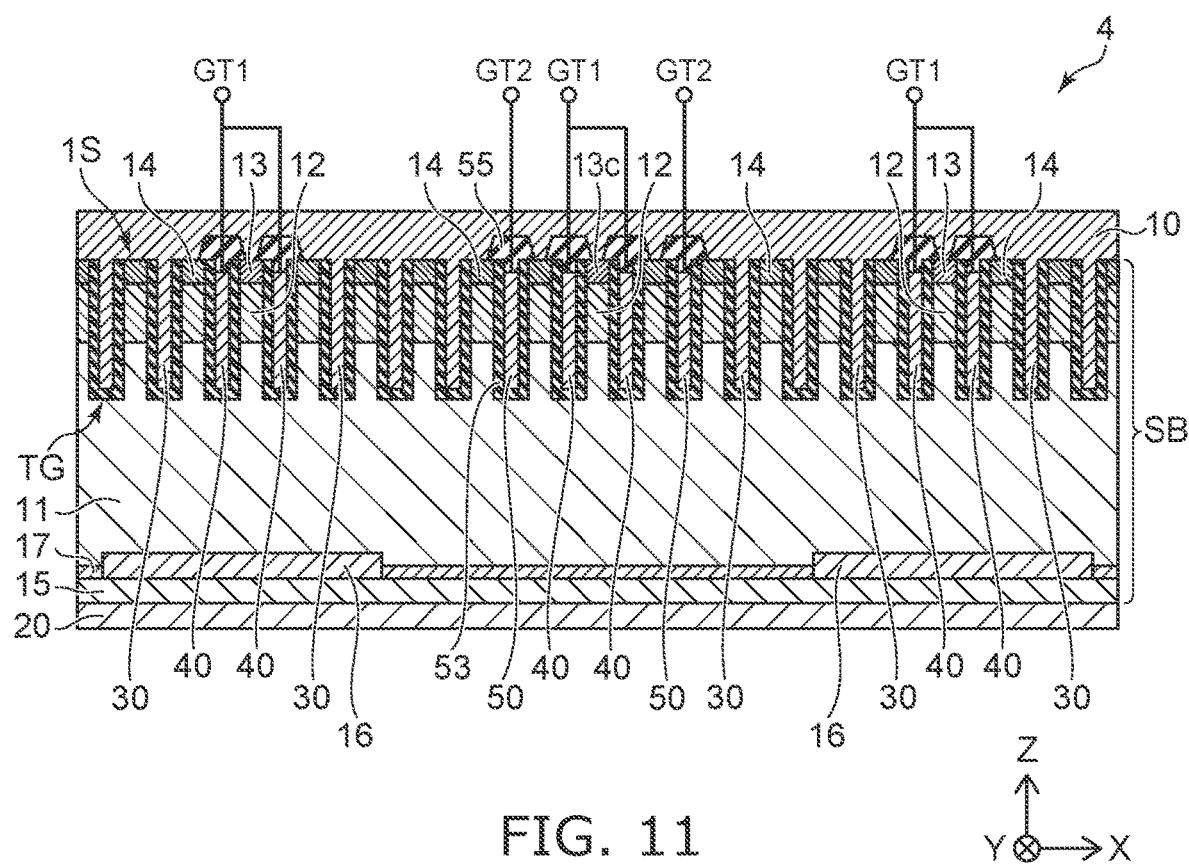
FIG. 11 is a schematic cross-sectional view showing a semiconductor device according to a second embodiment.

FIG. 11 is a schematic cross-sectional view showing a semiconductor device 4 according to a second embodiment. The semiconductor device 4 is, for example, an IGBT.

As shown in FIG. 11, the semiconductor device 4 includes the semiconductor part SB, the first electrode 10, the second electrode 20, the third electrode 30, the control electrode 40, and a control electrode 50. The semiconductor part SB is provided between the first electrode 10 and the second electrode 20 and includes the first to seventh semiconductor layers 11 to 17.

In the example, the control electrode 40 is also provided between the first electrode 10 and the seventh semiconductor layer 17. A third semiconductor layer 13c is provided between the first electrode 10 and the seventh semiconductor layer 17. The third semiconductor layer 13c is also provided between the adjacent control electrodes 40. In other words, an n-p-n parasitic transistor is also formed between the first electrode 10 and the seventh semiconductor layer 17.

The control electrode 50 is provided between the first electrode 10 and the seventh semiconductor layer 17. The control electrode 50 is provided at a position that is next to the control electrode 40. The control electrode 50 is provided inside another trench TG that has a depth enough to extend from the first surface 1S of the semiconductor part SB into the first semiconductor layer 11.

The control electrode 50 is provided between the semiconductor part SB and the first electrode 10. The control electrode 50 is electrically insulated from the semiconductor part SB by an insulating film 53. Also, the control electrode 50 is electrically insulated from the first electrode 10 by an insulating film 55. The control electrode 50 is electrically connected to, for example, a control terminal GT2. The control electrode 50 is controlled independently from the control electrode 40. The control terminal GT2 is, for example, another gate pad that is electrically insulated from the control terminal GT1.

The control electrode 50 faces the first semiconductor layer 11 and the second semiconductor layer 12 via the insulating film 53. A second-conductivity-type inversion layer, for example, can be induced at the interface between the first semiconductor layer 11 and the insulating film 53 by applying a negative potential to the control electrode 50 via the control terminal GT2. A hole ejection path from the first semiconductor layer 11 into the second semiconductor layer 12 via the second-conductivity-type inversion layer is formed thereby.

When a current filament is induced at the vicinity of the control electrode 40 between the first electrode 10 and the seventh semiconductor layer 17, a hole current can flow to the first electrode 10, for example, via the second-conductivity-type inversion layer and via the second and fourth semiconductor layers 12 and 14 that contact the insulating film 53. Thus, it is possible to prevent excessive injection of holes into the second semiconductor layer 12 that is positioned between the first semiconductor layer 11 and the third semiconductor layer 13c, and thereby, the n-p-n parasitic transistor can be prevented from turning on.

Figure 12:
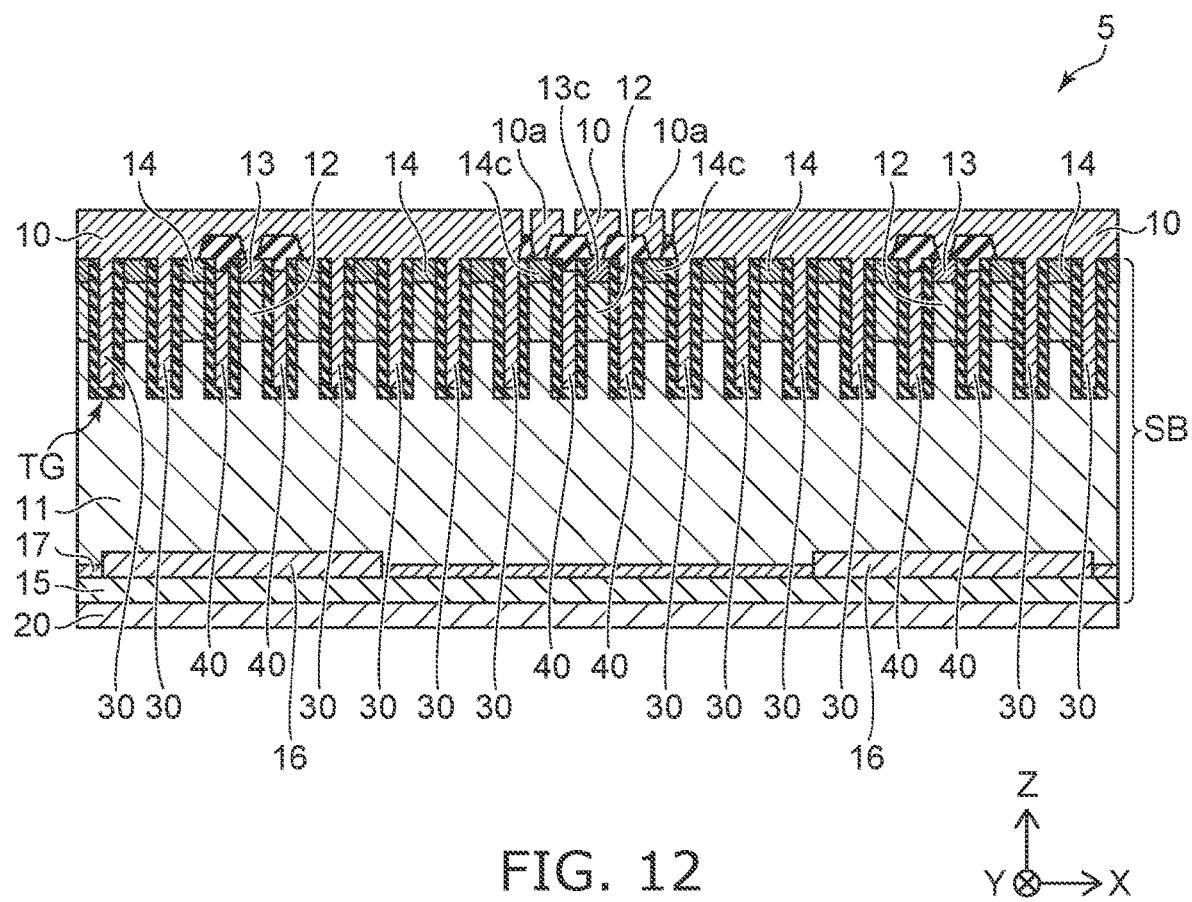
FIG. 12 is a schematic cross-sectional view showing a semiconductor device according to a first modification of the second embodiment.

FIG. 12 is a schematic cross-sectional view showing a semiconductor device 5 according to a first modification of the second embodiment. The semiconductor device 5 is, for example, an IGBT.

As shown in FIG. 12, the semiconductor device 5 includes the semiconductor part SB, the first electrode 10, the second electrode 20, the third electrode 30, and the control electrode 40. The semiconductor part SB is provided between the first electrode 10 and the second electrode 20 and includes the first to seventh semiconductor layers 11 to 17.

In the example, the control electrode 40 is also provided between the first electrode 10 and the seventh semiconductor layer 17. The third semiconductor layer 13c is provided between the first electrode 10 and the seventh semiconductor layer 17. The third semiconductor layer 13c is provided between the adjacent control electrodes. In other words, an n-p-n parasitic transistor is also formed between the first electrode 10 and the seventh semiconductor layer 17.

The semiconductor device 5 further includes another first electrode 10a that is electrically isolated from the first electrode 10. The first electrode 10a is provided at, for example, a position that overlaps the seventh semiconductor layer 17 in the Z-direction. The seventh semiconductor layer 17 is provided between the first electrode 10a and the second electrode 20. The first electrode 10a is electrically connected to a fourth semiconductor layer 14c that is next to the control electrode 40. The fourth semiconductor layer 14c is provided between the first electrode 10a and the seventh semiconductor layer 17. The fourth semiconductor layer 14c is also provided at a position proximate to the third semiconductor layer 13c.

The first electrode 10a is biased to, for example, a potential that is lower than that of the first electrode 10. Therefore, a larger hole current flows from the first semiconductor layer 11 to the first electrode 10a via the second and fourth semiconductor layers 12 and 14c positioned between the first electrode 10a and the first semiconductor layer 11. When a current filament induced at the vicinity of the control electrode 40, it is possible to prevent an excessive hole injection into the second semiconductor layer 12 that is positioned between the first semiconductor layer 11 and the third semiconductor layer 13c, because the hole current flows from the first semiconductor layer 11 to the first electrode 10a. Thereby, also in the semiconductor device 5, the n-p-n parasitic transistor can be prevented from turning on.

Figure 13:
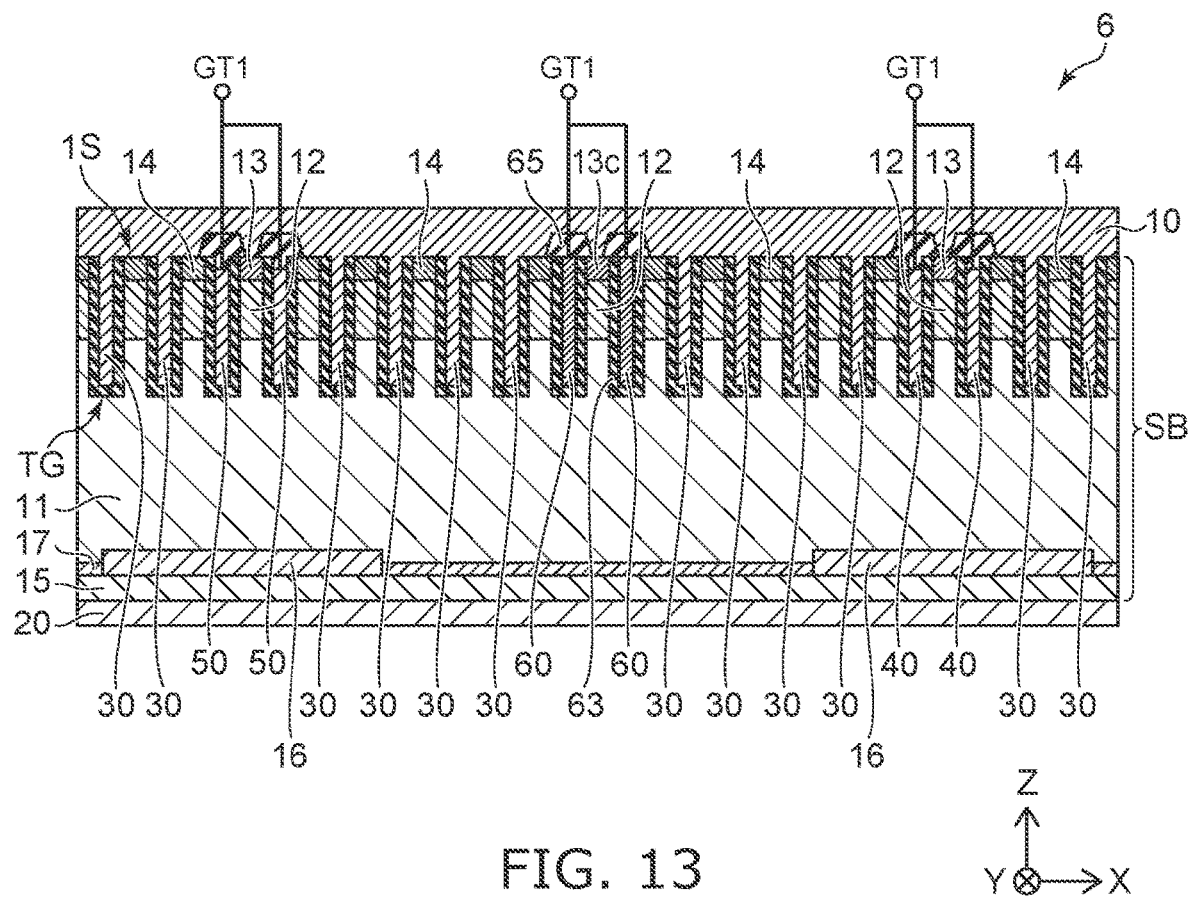
FIG. 13 is a schematic cross-sectional view showing a semiconductor device according to a second modification of the second embodiment.

FIG. 13 is a schematic cross-sectional view showing a semiconductor device 6 according to a second modification of the second embodiment. The semiconductor device 6 is, for example, an IGBT.

As shown in FIG. 13, the semiconductor device 6 includes the semiconductor part SB, the first electrode 10, the second electrode 20, the third electrode 30, the control electrode 40, and a control electrode 60. The semiconductor part SB is provided between the first electrode 10 and the second electrode 20 and includes the first to seventh semiconductor layers 11 to 17. The control electrode 60 is provided inside another trench TG that has a depth enough to extend from the first surface 1S of the semiconductor part SB into the first semiconductor layer 11.

In the example, the control electrode 60 is provided between the first electrode 10 and the seventh semiconductor layer 17. The control electrode 60 is provided between the semiconductor part SB and the first electrode 10. The control electrode 60 is electrically insulated from the semiconductor part SB by an insulating film 63. Also, the control electrode 60 is electrically insulated from the first electrode 10 by an insulating film 65. The control electrode 60 is electrically connected to, for example, the control terminal GT1. In other words, the same potential as that of the control electrode 40 is applied to the control electrode 60.

The third semiconductor layer 13c is provided next to the control electrode 60 with the insulating film 63 interposed. The third semiconductor layer 13c contacts the insulating film 63. In other words, an n-p-n parasitic transistor is also formed between the first electrode 10 and the seventh semiconductor layer 17.

The control electrode 60 includes a material different from materials of the third electrode 30 and the control electrode 40. The control electrode 60 includes the material with a higher thermal conductivity than a thermal conductivity of the materials in the third electrode 30 and the control electrode 40. The control electrode 60 is, for example, a metal such as tungsten, etc. The third electrode 30 and the control electrode 40 are, for example, polysilicon.

In the example, the control electrode 60 promotes heat dissipation from the semiconductor part SB. Thereby, the temperature increase due the Joule heat can be suppressed in the n-p-n parasitic transistor that is proximate to the control electrode 60, and the n-p-n parasitic transistor can be prevented from turning on.

Figure 14A:
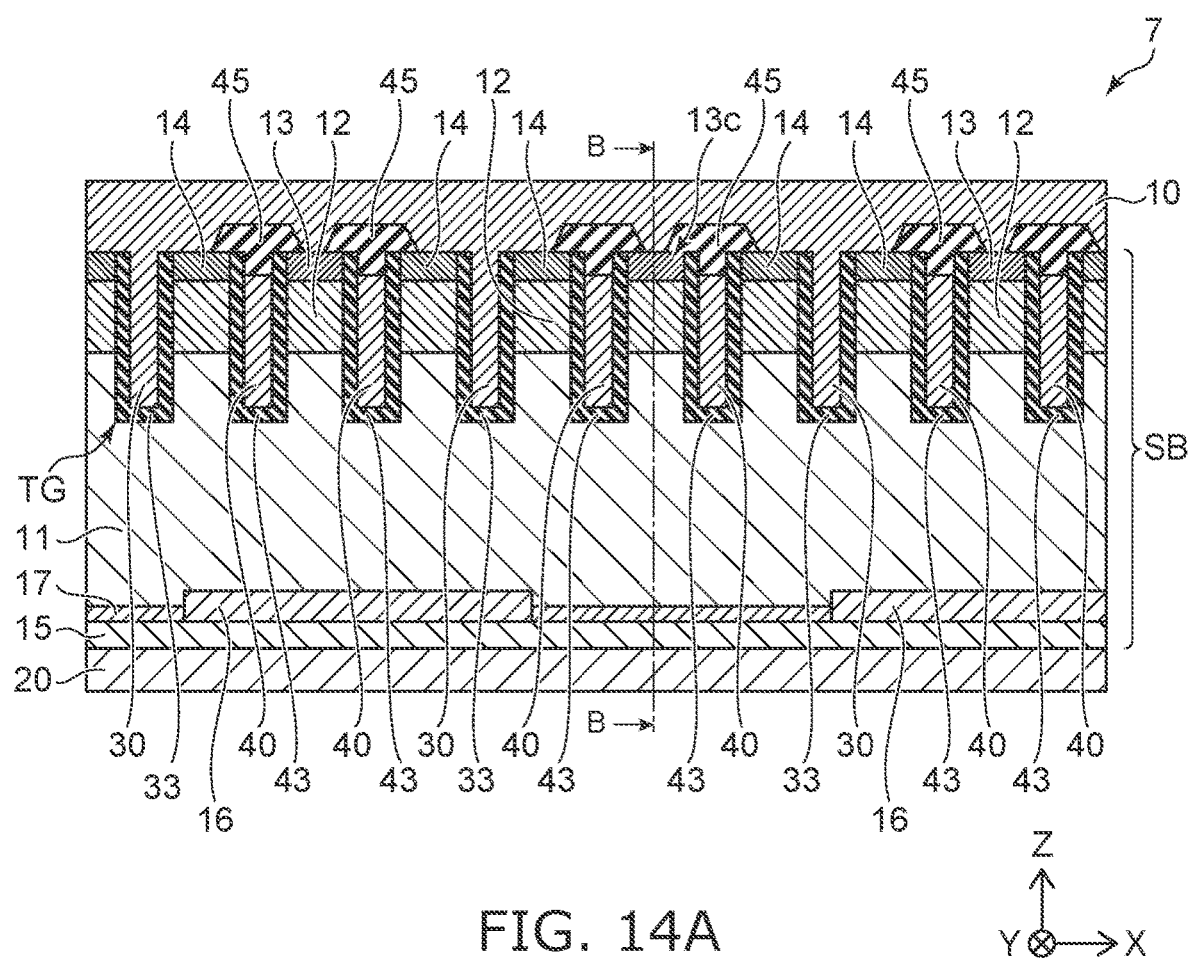
FIGS. 14A and 14B are schematic cross-sectional views showing a semiconductor device according to a third modification of the second embodiment.
Figure 14B:
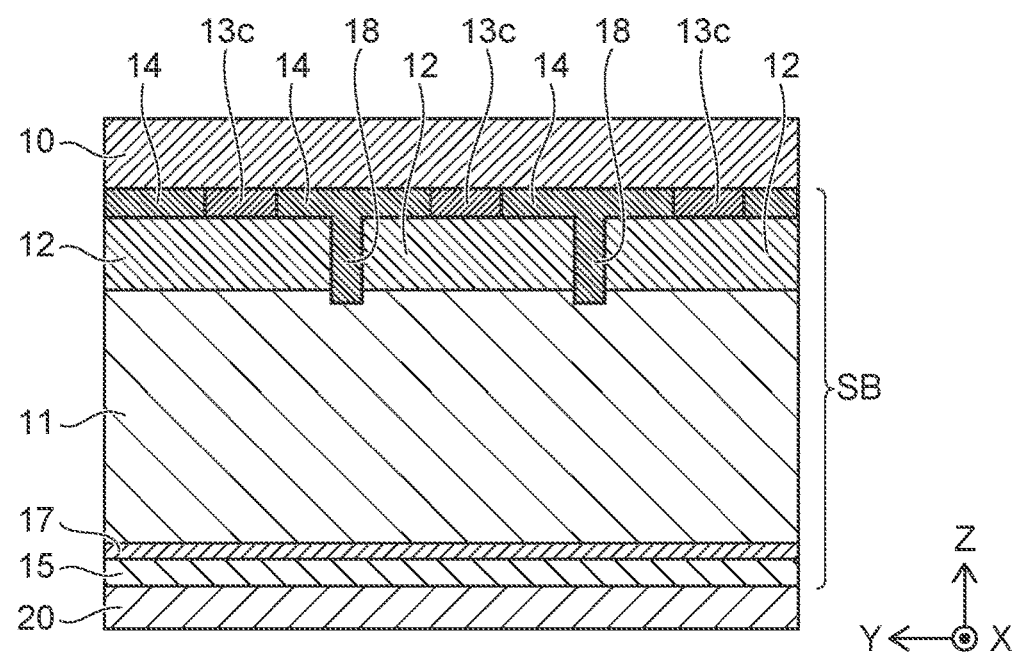

FIGS. 14A and 14B are schematic cross-sectional views showing a semiconductor device 7 according to a third modification of the second embodiment. FIG. 14B is a cross-sectional view along line B-B shown in FIG. 14A. The semiconductor device 7 is, for example, an IGBT.

As shown in FIG. 14A, the semiconductor device 7 includes the semiconductor part SB, the first electrode 10, the second electrode 20, the third electrode 30, and the control electrode 40. The semiconductor part SB is provided between the first electrode 10 and the second electrode 20 and includes the first to seventh semiconductor layers 11 to 17.

The control electrode 40 is also provided between the first electrode 10 and the seventh semiconductor layer 17. The third semiconductor layer 13c is also provided between the first electrode 10 and the seventh semiconductor layer 17 and is next to the control electrode 40 with the insulating film 43 interposed. In other words, an n-p-n parasitic transistor is also formed between the first electrode 10 and the seventh semiconductor layer 17.

As shown in FIG. 14B, the semiconductor part SB further includes an eighth semiconductor layer 18 of the second conductivity type. The eighth semiconductor layer 18 extends through the second semiconductor layer 12 at the vicinity of the third semiconductor layer 13c and links the first semiconductor layer 11 and the fourth semiconductor layer 14. The eighth semiconductor layer 18 includes a second-conductivity-type impurity with a higher concentration than the concentration of the second-conductivity-type impurity in the second semiconductor layer 12.

The eighth semiconductor layer 18 is provided as a low-resistance hole ejection path from the first semiconductor layer 11 to the fourth semiconductor layer 14. Therefore, when a current filament occurs at the vicinity of the control electrode 40, a hole current flows into the fourth semiconductor layer 14 via the eighth semiconductor layer 18. Thereby, it is possible to prevent an excessive hole injection into the region of the second semiconductor layer 12 that is positioned between the first semiconductor layer 11 and the third semiconductor layer 13c, and the n-p-n parasitic transistor can be prevented from turning on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor part including a first semiconductor layer of a first conductivity type, a second semiconductor layer of a second conductivity type, a third semiconductor layer of the first conductivity type, at least one fourth semiconductor layer of the second conductivity type, a fifth semiconductor layer of the second conductivity type, at least one sixth semiconductor layer of the first conductivity type, a seventh semiconductor layer of the first conductivity type, the semiconductor part having a first surface and a second surface at a side opposite to the first surface;
a first electrode provided on the first surface of the semiconductor part, the second semiconductor layer being provided between the first semiconductor layer and the first electrode, the third and fourth semiconductor layers being provided between the second semiconductor layer and the first electrode, the first electrode being electrically connected to the third and fourth semiconductor layers, the third and fourth semiconductor layers being arranged along the first surface of the semiconductor part;
a second electrode provided on the second surface of the semiconductor part, the semiconductor part being provided between the first electrode and the second electrode, the first semiconductor layer extending between the first electrode and the second electrode, the fifth semiconductor layer being provided between the second electrode and the first semiconductor layer, the fifth semiconductor layer being electrically connected to the second electrode, the sixth and seventh semiconductor layers being provided between the first and fifth semiconductor layers, the sixth and seventh semiconductor layers being arranged along the fifth semiconductor layer, the sixth and seventh semiconductor layers including a first-conductivity-type impurity with higher concentrations than a concentration of a first-conductivity-type impurity in the first semiconductor layer, the sixth semiconductor layer including the first-conductivity-type impurity with a first surface density in a plane parallel to the second surface, the seventh semiconductor layer including the first-conductivity-type impurity with a second surface density in the plane parallel to the second surface, the first surface density being greater than the second surface density, the seventh semiconductor layer being provided between two adjacent portions of the sixth semiconductor layer, or between the sixth semiconductor layer and another sixth semiconductor layer; and
at least one control electrode provided between the semiconductor part and the first electrode, the control electrode being electrically insulated from the semiconductor part by a first insulating film and electrically insulated from the first electrode by a second insulating film, the control electrode facing the first and second semiconductor layers via the first insulating film, the first to third semiconductor layers being arranged along the first insulating film.

2. The device according to claim 1, wherein
the seventh semiconductor layer has a layer thickness in a first direction, the first direction being from the second electrode toward the first electrode, the layer thickness of the seventh semiconductor layer being less than a layer thickness of the sixth semiconductor layer in the first direction.

3. The device according to claim 1, wherein
the semiconductor part has a first-conductivity-type impurity distribution in a first direction, the first direction being from the second electrode toward the first electrode, and
the first-conductivity-type impurity distribution of the semiconductor part includes a first peak concentration in the sixth semiconductor layer and a second peak concentration in the seventh semiconductor layer, the second peak concentration being greater than the first peak concentration.

4. The device according to claim 1, wherein
the semiconductor part includes an active region and a termination region in a plane parallel to the first surface, the active region including the second semiconductor layer, the termination region surrounding the active region, and
the seventh semiconductor layer is provided in the active region when viewed along a direction perpendicular to the first surface.

5. The device according to claim 4, wherein
the seventh semiconductor layer is provided along a boundary between the active region and the termination region when viewed along the direction perpendicular to the first surface.

6. The device according to claim 1, wherein
the control electrode is provided inside a trench extending from the first surface of the semiconductor part into the first semiconductor layer.

7. The device according to claim 6, further comprising:
a third electrode provided inside another trench extending from the first surface of the semiconductor part into the first semiconductor layer.

8. The device according to claim 1, wherein
the control electrode is provided between the first electrode and the sixth semiconductor layer, and the control electrode is not provided between the first electrode and the seventh semiconductor layer.

9. The device according to claim 1, further comprising:
a plurality of control terminals electrically connected to a plurality of the control electrodes, the control terminals including first and second control terminals, the control electrodes including the first to third control electrode, the first control electrode being provided between the first electrode and the sixth semiconductor layer, the second control electrode being provided between the first electrode and the seventh semiconductor layer, the third control electrode being provided between the first electrode and the seventh semiconductor layer, wherein
the first control terminal is electrically connected to the first and second control electrodes; and the second control terminal is electrically connected to the third control electrode.

10. The device according to claim 9, wherein
the third control electrode is provided at a position adjacent to the second control electrode.

11. The device according to claim 1, further comprising:
a fourth electrode provided on the first surface of the semiconductor part, the fourth electrode being apart from the first electrode, the fourth electrode being provided at a position overlapping the seventh semiconductor layer in a first direction, the first direction being from the second electrode toward the first electrode, wherein
the semiconductor part further includes another third semiconductor layer electrically connected to the fourth electrode, and
a plurality of the control electrodes are provided, the control electrodes including first and second control electrode, the first control electrode being provided between the first electrode and the sixth semiconductor layer, the second control electrode being provided between the first electrode and the seventh semiconductor layer, said another third semiconductor layer being next to the second control electrode.

12. The device according to claim 1, wherein
a plurality of the control electrodes are provided, the control electrodes including first and second control electrode, the first control electrode being provided between the first electrode and the sixth semiconductor layer, the second control electrode being provided between the first electrode and the seventh semiconductor layer, and
the second control electrode has a higher thermal conductivity than a thermal conductivity of the first control electrode.

13. The device according to claim 12, wherein the first control electrode includes polysilicon, and the second control electrode includes a metal.

14. The device according to claim 1, wherein
a plurality of the control electrodes are provided, the control electrodes including first and second control electrode, the first control electrode being provided between the first electrode and the sixth semiconductor layer, the second control electrode being provided between the first electrode and the seventh semiconductor layer, and
the semiconductor part further includes an eighth semiconductor layer of the second conductivity type, the eighth semiconductor layer including a second-conductivity-type impurity with a higher concentration than a concentration of a second-conductivity-type impurity in the second semiconductor layer,
the eighth semiconductor layer extending in the second semiconductor layer between the first electrode and the seventh semiconductor layer, the eighth semiconductor layer being linked to the first and fourth semiconductor layers, the eighth semiconductor layer being provided at a position next to the second control electrode.

15. The device according to claim 14, wherein
the control electrodes further include another second control electrode provided between the first electrode and the seventh semiconductor layer, said another second control electrode being adjacent to the second control electrode, and
the eighth semiconductor layer is provided between the second control electrode and said another second control electrode.

16. The device according to claim 1, wherein
the control electrode extends in a second direction, the second direction being along the first surface, and
the seventh semiconductor layer extends in the second direction.

17. The device according to claim 1, wherein
the semiconductor part includes a plurality of the seventh semiconductor layers, and
the plurality of seventh semiconductor layers is apart from each other in a plane parallel to the second surface.

18. The device according to claim 17, wherein
the plurality of seventh semiconductor layers is arranged in a second direction and a third direction, the second direction being along the first surface, the third direction crossing the second direction in the first surface.

* * * * *